(12) United States Patent
Heiss et al.

(10) Patent No.: US 11,837,675 B2
(45) Date of Patent: Dec. 5, 2023

(54) SEMITRANSPARENT THIN-FILM SOLAR MODULE

(71) Applicant: CNBM RESEARCH INSTITUTE FOR ADVANCED GLASS MATERIALS GROUP CO., LTD., Bengbu (CN)

(72) Inventors: Andreas Heiss, Penzing (DE); Joerg Palm, Munich (DE); Helmut Vogt, Munich (DE); Robert Lechner, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 155 days.

(21) Appl. No.: 16/650,590

(22) PCT Filed: Sep. 27, 2018

(86) PCT No.: PCT/CN2018/107795
§ 371 (c)(1),
(2) Date: Mar. 25, 2020

(87) PCT Pub. No.: WO2019/062788
PCT Pub. Date: Apr. 4, 2019

(65) Prior Publication Data
US 2020/0227578 A1     Jul. 16, 2020

(30) Foreign Application Priority Data
Sep. 29, 2017 (EP) .................................... 17194085

(51) Int. Cl.
*H01L 31/0468* (2014.01)
*H01L 31/0463* (2014.01)

(52) U.S. Cl.
CPC ...... *H01L 31/0468* (2014.12); *H01L 31/0463* (2014.12)

(58) Field of Classification Search
CPC ............. H01L 31/0468; H01L 31/0463; H01L 31/0749; H01L 31/022425; H01L 31/0465; H01L 31/046; Y02E 10/50; Y02E 10/541
See application file for complete search history.

(56) References Cited

U.S. PATENT DOCUMENTS

| 2009/0205710 A1 | 8/2009 | Kim et al. |
| 2010/0013037 A1 | 1/2010 | Park et al. |

(Continued)

FOREIGN PATENT DOCUMENTS

| CN | 101515609 A | 8/2009 |
| CN | 101771091 A | 7/2010 |

(Continued)

OTHER PUBLICATIONS

International Search Report for International PCT App. No. PCT/CN2018/107516 filed on Sep. 26, 2018 on behalf of Bengeu Design & Research Institute, dated Jan. 3, 2019. 4 Pages.

(Continued)

*Primary Examiner* — Michael Y Sun
(74) *Attorney, Agent, or Firm* — Bayramoglu Law Offices LLC

(57) ABSTRACT

A thin-film solar module with a substrate and a layer structure applied thereon that comprises a rear electrode layer, a front electrode layer, and an absorber layer arranged between the back electrode layer and the front electrode layer. Serially connected solar cells are formed in the layer structure by patterning zones, wherein each patterning zone comprises a first patterning line for subdividing at least the rear electrode layer, a second patterning line for subdividing (Continued)

Figure 1:
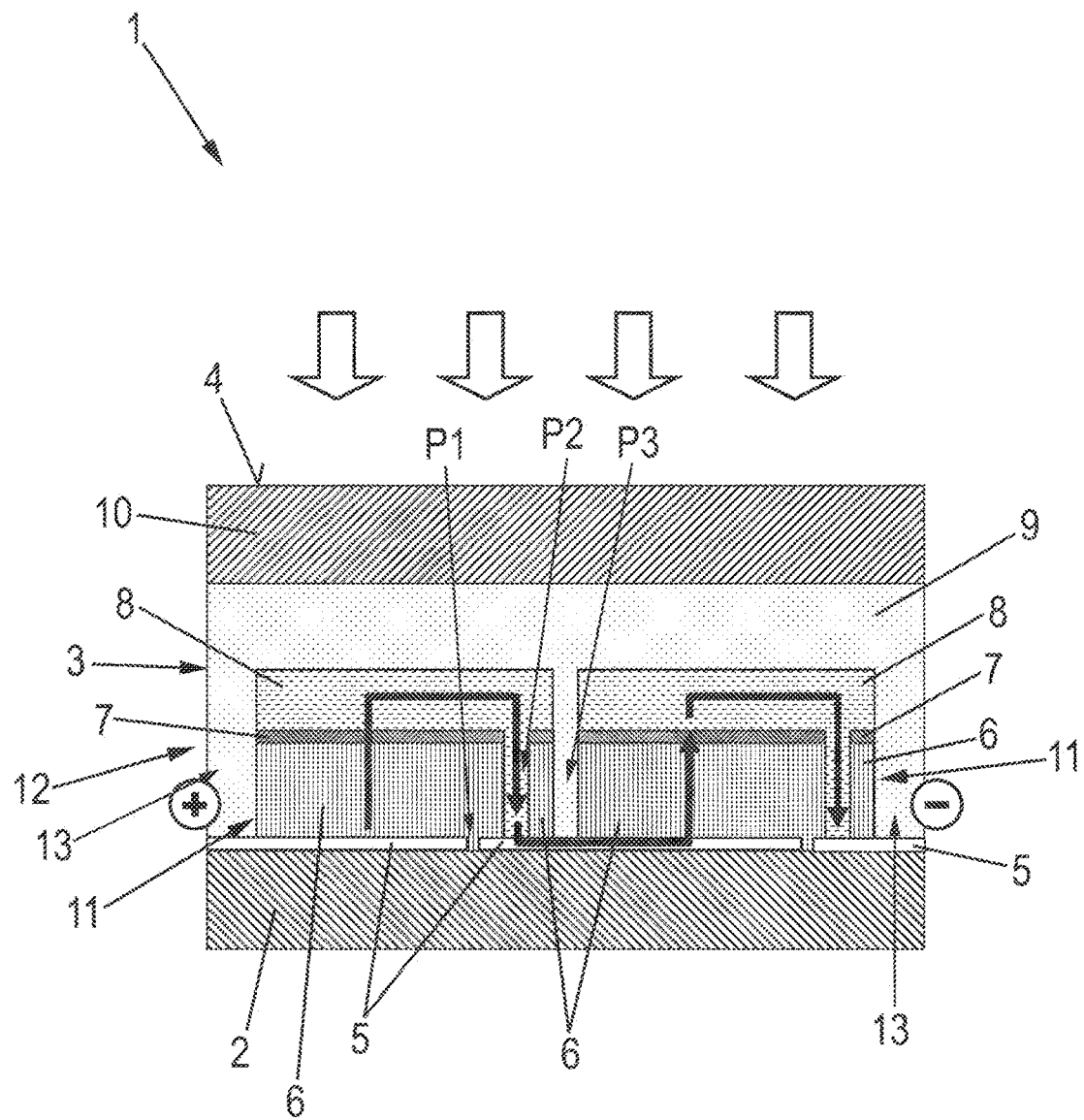

at least the absorber layer, and at least one third patterning line for subdividing at least the front electrode layer. At least one patterning zone has one or more optically transparent zones in a zone region reduced by the first patterning line, which are in each case rear-electrode-layer-free, wherein the one or more optically transparent zones are implemented such that the rear electrode layer is continuous in the zone region.

15 Claims, 7 Drawing Sheets

(56) References Cited

U.S. PATENT DOCUMENTS

| | | | |
|---|---|---|---|
| 2011/0011453 A1* | 1/2011 | Kang | H01L 31/046 438/57 |
| 2012/0103416 A1* | 5/2012 | Kwon | H01L 31/022425 136/256 |
| 2013/0025661 A1 | 1/2013 | Shin et al. | |
| 2013/0050418 A1 | 2/2013 | Nishioka et al. | |
| 2013/0233380 A1* | 9/2013 | Zhao | H01L 31/0749 438/94 |
| 2013/0319518 A1 | 12/2013 | Doech et al. | |
| 2014/0305492 A1 | 10/2014 | Verger et al. | |
| 2015/0136198 A1* | 5/2015 | Nam | H01L 31/0468 136/244 |
| 2016/0126407 A1 | 5/2016 | Cardi et al. | |
| 2016/0211396 A1 | 7/2016 | Karst et al. | |
| 2018/0138336 A1* | 5/2018 | Kim | H01L 31/0687 |
| 2018/0254365 A1* | 9/2018 | Kim | H01L 31/0445 |
| 2020/0266313 A1 | 8/2020 | Heiss et al. | |
| 2020/0279962 A1 | 9/2020 | Heiss et al. | |

FOREIGN PATENT DOCUMENTS

| | | |
|---|---|---|
| CN | 102970569 A | 3/2013 |
| CN | 103155157 A | 6/2013 |
| CN | 103718307 A | 4/2014 |
| CN | 105140310 A | 12/2015 |
| TW | 201019492 A | 5/2010 |
| WO | 2012/029780 A1 | 3/2012 |
| WO | 2014/188092 A1 | 11/2014 |
| WO | 2015/033291 A1 | 3/2015 |
| WO | 2019/062739 A1 | 4/2019 |
| WO | 2019/062773 A1 | 4/2019 |

OTHER PUBLICATIONS

International Search Report for International PCT App. No. PCT/CN2018/107709 filed on Sep. 26, 2018 on behalf of Bengeu Design & Research Institute, dated Jan. 4, 2019. 3 Pages.
International Search Report for International PCT App. No. PCT/CN2018/107795 filed on Sep. 27, 2018 on behalf of Bengeu Design & Research Institute, dated Nov. 30, 2018. 3 Pages.
Written Opinion for International PCT Appl. No. PCT/CN2018/107516 filed on Sep. 26, 2018 on behalf of Bengbu Design & Research Institute, dated Jan. 3, 2019. 3 Pages.
Written Opinion for International PCT Appl. No. PCT/CN2018/107709 filed on Sep. 26, 2018 on behalf of Bengbu Design & Research Institute, dated Jan. 4, 2019. 3 Pages.
Written Opinion for International PCT Appl. No. PCT/CN2018/107795 filed on Sep. 27, 2018 on behalf of Bengbu Design & Research Institute, dated Nov. 30, 2018. 3 Pages.
Restriction Requirement for U.S. Appl. No. 16/649,979, filed Mar. 23, 2020 on behalf of Bengbu Design & Research Institute dated Apr. 5, 2021, 9 pages.

* cited by examiner

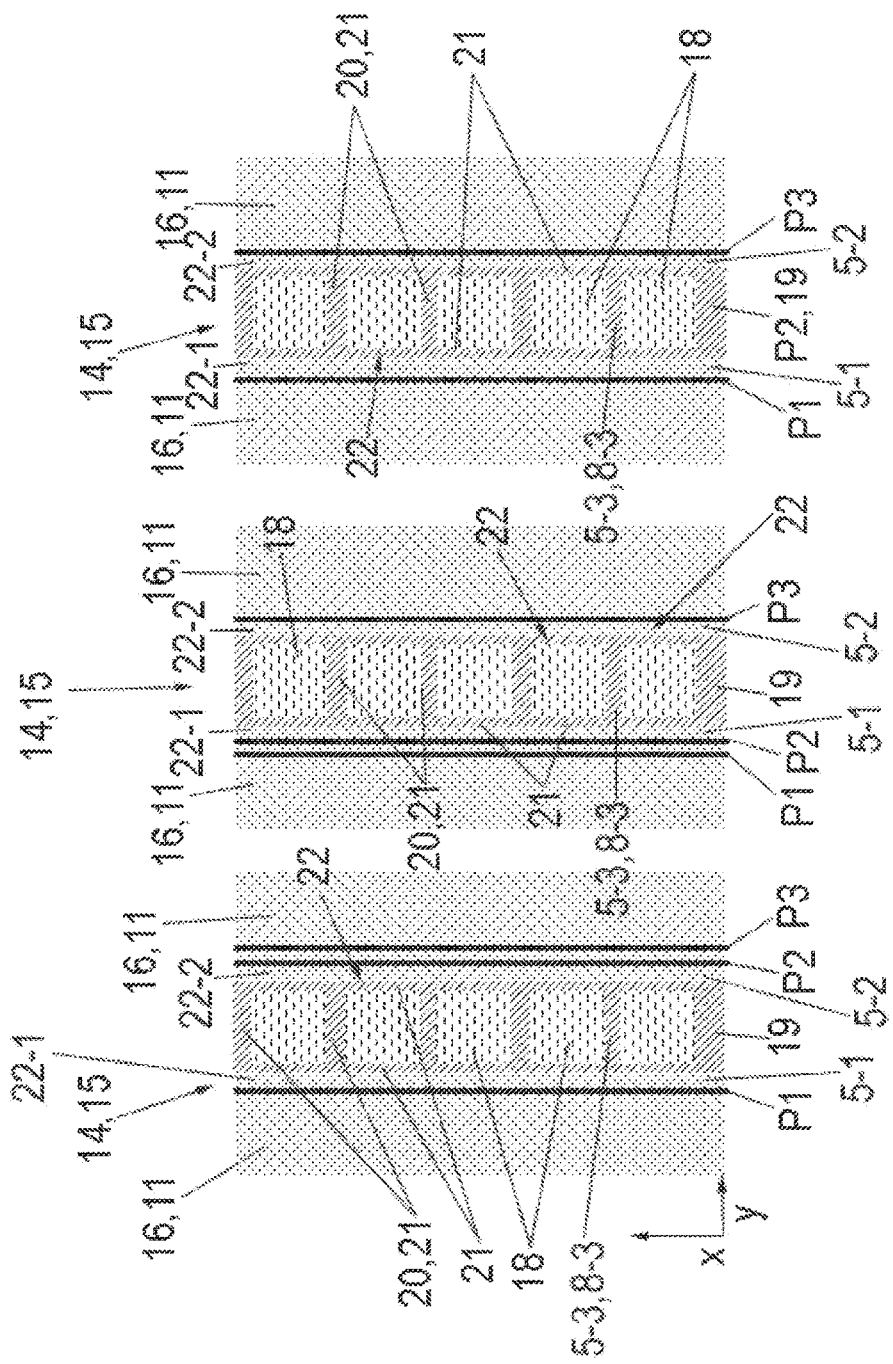

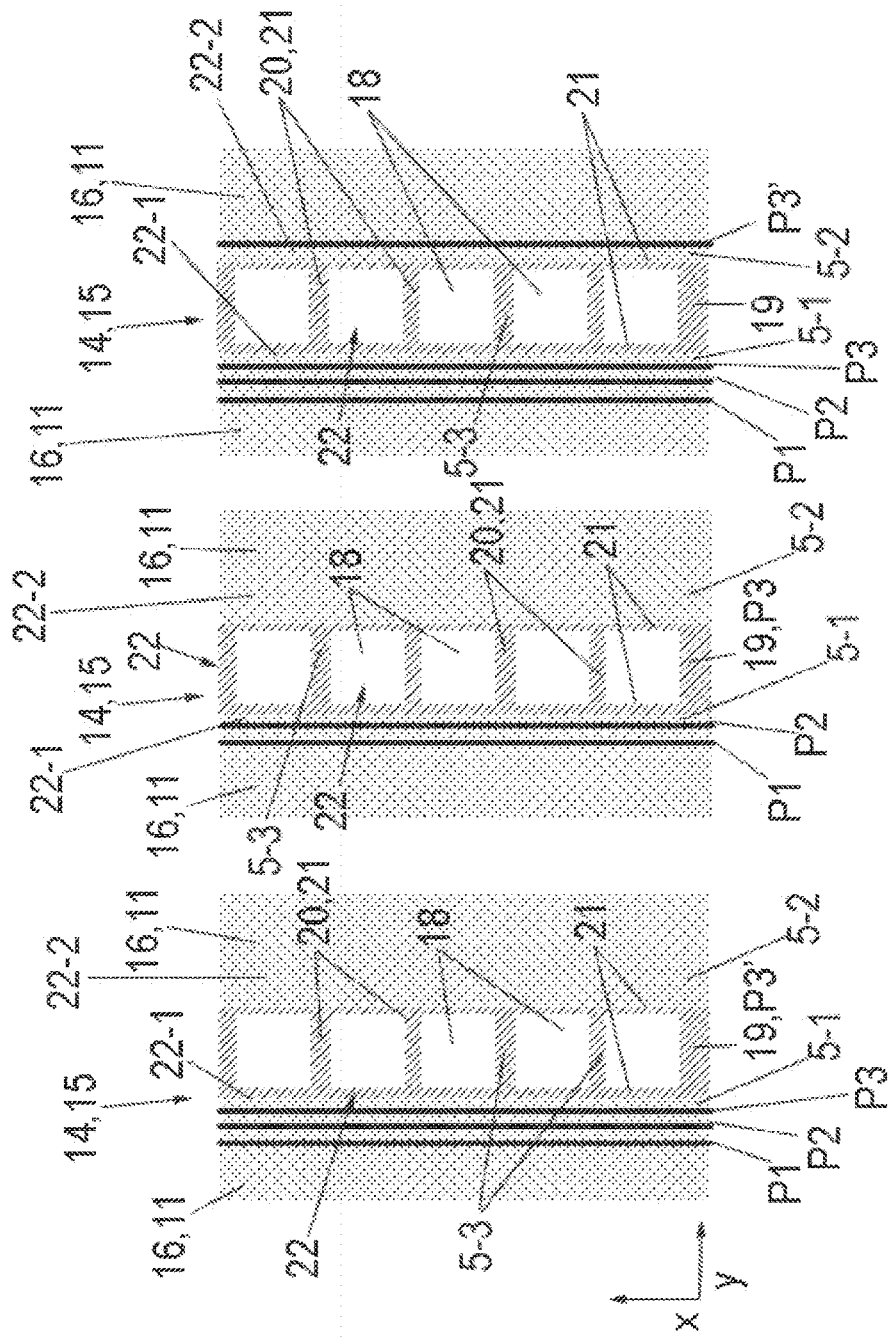

SEMITRANSPARENT THIN-FILM SOLAR MODULE

CROSS REFERENCE TO RELATED APPLICATIONS

The present application is the U.S. national stage of International Patent Application PCT/CN2018/107795 filed internationally on Sep. 27, 2018, which, in turn, claims priority to European Patent Application No. 17194085.1 filed on Sep. 29, 2017.

In open-space systems, large growth in solar modules can be observed; however, applications in the building-integrated setting are currently still moving in a much smaller scale. In light of intensified efforts toward decentralized energy solutions, a real demand is developing to be able to also use façade surfaces for photovoltaic power generation. For architectonic and structural engineering reasons, both flat opaque solar modules and light permeable solar modules are necessary for integration into buildings. Permeability to visible light averaged over the total area of the solar module in the range from 5 to 50% (optical semitransparency) is desirable in order to have, on the one hand, adequate electrical power and, on the other, to ensure sufficient light transmittance. Other areas of application for semitransparent solar modules are noise abatement walls (roadway, railway), privacy barriers in outdoor areas, or walls for greenhouses.

In contrast to crystalline silicon technology (c-Si), in which the solar cells can, in principle, only be realized opaque, thin-film solar cells have the advantage that as a result of the monolithic serial connection electrically and optically active areas as well as surrounding passive regions can be very flexibly designed. In addition, significantly higher efficiency levels can be achieved by chalcopyrite-based absorbers than with absorbers based on amorphous silicon. One characteristic of the process technology in the production of thin-film solar cells is the sequential execution of full-surface coating and local decoating, wherein, for example, for producing the solar cells, different layers are applied directly onto a carrier substrate, which is glued ("laminated") after patterning of the layers to a front-side transparent cover layer to form a weathering-stable composite. Masking processes, as are customary in microelectronics, are avoided by means of the full-surface coating and local decoating. For large thin-film solar modules, masking processes are very cost intensive and time-consuming.

Until now, primarily thin-film silicon has been used as the starting material for absorbers for producing semitransparent modules, in particular in conjunction with a transparent front electrode and a transparent rear electrode. For this, the absorber has been made so thin that the entire layer system is transparent to electromagnetic radiation in the range of infrared and red wavelengths. However, an undesirable color filter effect often develops as a result of the thin absorber.

In contrast, the object of the present invention consists in advantageously improving semitransparent thin-film solar modules known in the prior art as well as their production, wherein the modules should have a relatively large optically active area with noteworthy transparency in the visible light range. Also, the modules should be visually appealing and, in particular, have no color filter effect.

These and other objects are accomplished according to the proposal of the invention by a semitransparent thin-film solar module as well as a method for its production in accordance with the coordinate claims. Advantageous embodiments of the invention are indicated through the features of the subclaims.

In the context of the present invention, the term "transparency" refers to visible-light transmittance of at least 85%. Typically, visible light is in the wavelength range from 380 nm to 780 nm. The term "opacity" refers to visible-light transmittance of less than 5%. Accordingly, an optically transparent zone of a solar cell has visible-light transmittance in the range from 85% to 100%; an opaque zone has visible-light transmittance in the range from 0% (completely opaque) to less than 5%. The term "semitransparency" refers to visible-light transmittance in the range from 5% to less than 85%. In the context of the present invention, the term "semitransparency" is used in connection with visible-light transmittance averaged over the entire area of all solar cells of the thin-film solar module, in other words, the desired semitransparency results from averaging the optical transmittance of opaque and optically transparent regions over all solar cells of the thin-film solar module.

According to the invention, a semitransparent thin-film solar module with integrated serially connected solar cells is presented. In keeping with the above definition of the term "semitransparency", the thin-film solar module has (optically) opaque and optically transparent regions of the solar cells, wherein the semitransparency of the solar cells is the result of averaging the visible-light transmittance over the entire area of all solar cells. The (semi)transparency of a thin-film solar module can be determined in a simple manner by a measurement arrangement, in which, for example, a white light source (visible light source) is arranged on one side of the thin-film solar module and a detector of visible light is arranged on the other side of the thin-film solar module. It is essential here that the detector can detect the light passing through all solar cells of the thin-film solar module (for example, simultaneously) in order to enable averaging the optical transparency of the thin-film solar module over the entire area of the solar cells.

The thin-film solar module according to the invention comprises a substrate with a layer structure with monolithically integrated serial connection of solar cells for photovoltaic energy generation. In keeping with the customary use of the term "thin-film solar module", it refers to modules with a layer structure with a low thickness of, for example, a few microns such that a carrier substrate is required for adequate mechanical stability. The carrier substrate can be made, for example, of inorganic glass, plastic, or metal, in particular, of a metal alloy, and can be designed, depending on the respective layer thickness and the specific material properties, as a rigid plate or a flexible film. The invention refers both to a thin-film solar module in substrate configuration, wherein, for producing the solar cells, the layer structure is applied on a substrate surface facing the light-incident side as well as to a thin-film solar module in superstrate configuration, wherein the substrate is transparent and the layer structure is applied on a substrate surface facing away from the light-incident side.

In a manner known per se, the layer structure comprises a rear electrode layer, a front electrode layer, and a photovoltaically active absorber layer arranged between the rear electrode and the front electrode layer. Preferably, the absorber layer is made of a chalcopyrite compound, which is, for example, a semiconductor from the group copper indium/gallium disulfide/diselenide ($Cu(In,Ga)(S,Se)_2$), for example, copper indium diselenide ($CuInSe_2$ or CIS) or related compounds. The absorber layer is typically opaque or, if it is very thin, at least frequency-selectively transparent such that, generally speaking, a certain color filter effect or frequency filter effect occurs. The rear electrode layer is typically opaque. The front electrode layer is typically optically transparent, in particular in the case of thin-film solar modules in substrate configuration, since passage of light to the layer structure must be enabled.

In the layer structure, the integrated serially connected solar cells are formed conventionally by means of patterning zones. Thus, at least the rear electrode layer is subdivided into sections by first patterning lines P1, which sections form the rear electrodes of the solar cells. In addition, at least the absorber layer is subdivided into sections by second patterning lines P2, which sections are in each case absorbers associated with the solar cells, and at least the front electrode layer is subdivided into sections by third patterning lines P3, which sections form the front electrodes of the solar cells. Solar cells adjacent one another are electrically connected serially to one another via the second patterning lines P2, wherein the front electrode of one solar cell is electrically connected to the rear electrode of the adjacent solar cell and typically, but not mandatorily, directly contacts it.

The patterning lines are, generally speaking, arranged in the order P1-P2-P3. A patterning zone is formed by a direct sequence of first to third patterning line P1-P2-P3. The patterning zone can be, for example, linear, in particular, rectilinear. The patterning lines are, generally speaking, arranged parallel to one another in the sequence comprising the first to third patterning line P1-P2-P3 and run, for example, parallel to one edge of a rectangular or square module. For example, the patterning lines P1-P2-P3 can in each case extend all the way to the edge of the layer structure. The direction of extension of the patterning lines P1-P2-P3 can be defined as module or solar cell width; the direction perpendicular thereto, as module or solar cell length. Each solar cell has, for example, a width that corresponds to the width of the layer structure.

In keeping with the common use of the term, in the context of the present invention, the term "solar cell" refers to a region of the layer structure (hereinafter also referred to as "layer region") that has a front electrode (or front electrode layer section), an absorber (or absorber layer section), and a rear electrode (or rear electrode layer section) and is delimited by two patterning zones directly adjacent one another, consisting in each case of the patterning lines P1-P2-P3. This applies by analogy in the edge region of the module, wherein, instead of a patterning zone, there is a connection section for electrically contacting the serial connection of the solar cells such that the solar cell is defined by the layer region with a front electrode, absorber, and rear electrode, which is situated between a patterning zone and the immediately adjacent connection section.

Each patterning zone forms a photovoltaically inactive (dead) zone, whereas, in contrast, the layer region has a (single) photovoltaically active zone and is photovoltaically active. The layer region can, in particular, also have photovoltaically inactive zones. If the layer region has, in addition to the photovoltaically active zone, no photovoltaically inactive zones, the layer region and the photovoltaically active zone are identical. Otherwise, the layer region is composed of the photovoltaically active zone and one or more photovoltaically inactive zones.

According to the present invention, at least one patterning zone has one or more optically transparent zones in a zone region reduced by the first patterning line P1 (without the first patterning line P1), i.e. the zone region does not contain the first patterning line P1 of the patterning zone. Accordingly, the zone region is only part of the photovoltaically inactive patterning zone. The zone region corresponds to the photovoltaically inactive patterning zone without the first patterning line P1, i.e., the zone region and the first patterning line P1 together form the patterning zone. The zone region does not extend into the photovoltaically active layer region and thus is photovoltaically inactive. The one or more optically transparent zones are only arranged within patterning zone, more partiucularlay zone region. The one or more optically transparent zones are not arranged in the photovoltaically active layer regions. To achieve the desired optical transparency, the one or more optically transparent zones are, in each case at least rear-electrode-layer-free. Particularly advantageously, the one or more transparent zones are also absorber-layer-free. Due to the lack of a rear electrode layer and the optional lack of an absorber layer, high visible-light transmittance of at least 85% can be obtained in the optically transparent zones.

According to one embodiment of the invention, the optically transparent zones have a front electrode layer section. Alternatively, the one or more transparent zones can also be front-electrode-layer-free. In certain embodiments of the invention, the optically transparent zones mandatorily have a front electrode layer section. In certain alternative embodiments of the invention, it is necessary for the optically transparent zones to have no front electrode layer section.

It is essential here for the one or more optically transparent zones to be implemented such that the rear electrode layer is (areally) continuous and is not completely subdivided in the zone region reduced by the first patterning line P1 (i.e. zone region without first patterning line). Each patterning zone thus has, in a zone region reduced by the first patterning zone, an areally continuous rear electrode layer. This assumes that none of the optically transparent zones is implemented such that it extends over the complete zone region.

It can be advantageous for a plurality of optically transparent zones to be arranged linearly, in other words, along an imaginary line. This linear arrangement of optically transparent zones can, for example, be arranged perpendicular (i.e., at an angle of 90°) or parallel (i.e., at an angle of 0°) to the patterning lines P1-P2-P3. It is, however, also possible for the linear arrangement of optically transparent zones to be arranged at an angle different from 0° or 90° oblique to the patterning lines P1-P2-P3. Generally speaking, the linear arrangement of optically transparent zones has the process-technology advantage that the optically transparent zones can be realized particularly simply, quickly, and economically by linear movement of a tool for producing the optically transparent zones.

The optically transparent zones can, in principle, have any shape. Preferably, the transparent zones are in each case linear, punctiform, circular disc-shaped, or square. Advantageously, in terms of the overall visual impression of the module, the optically transparent zones are implemented as individual zones separated from one another. Particularly advantageously, the optically transparent zones are arranged distributed uniformly.

According to an advantageous embodiment of the invention, the first patterning line P1 and/or the at least one third patterning line P3 have in each case at least one bulge (in other words, a deviation from the straight line course transverse to the direction of extension of the patterning line), in which an optically transparent zone is arranged.

The at least one bulge is a change of course of a patterning line transverse to the extension of the patterning line, wherein sections of the patterning line adjacent to the bulge at both sides of the bulge are on a same (imaginary) line which corresponds to the direction of extension of the patterning line. The bulge thus forms a deepening of the patterning line which can be closed by the (imaginary) line corresponding to the extension of direction of the patterning line. The bulge can, in principle, have any shape and be, for example, part-circular, in particular semicircular, square, rectangular, or triangular. Advantageously, the first patterning line P1 and/or the at least one third patterning line P3 have in each case a plurality of bulges, with an optically transparent zone arranged in each bulge. Advantageously, the optically transparent zones that are arranged in bulges of one and the same patterning line are arranged linearly.

According to another advantageous embodiment of the invention, the first patterning line P1 and the third patterning line P3 have in each case at least one bulge, with at least one bulge of the first patterning line P1 arranged opposite a bulge of the third patterning line P3. In particular, the first patterning line P1 and the third patterning line P3 can in each case have a plurality of bulges, with the bulges of the first patterning line P1 arranged in each case opposite the bulges of the third patterning line P3. In the last-mentioned variant, the second patterning line P2 can be removed in the region between the opposing bulges.

According to another advantageous embodiment of the invention, at least one patterning zone has at least one linear decoating region in the zone region reduced by the first patterning line P1 (without first patterning line P1), which extends parallel to the patterning lines P1 to P3 over the complete patterning zone, by which means the zone region is subdivided into two adjacent zone region portions. The zone region portions have in each case a rear electrode layer section.

The linear decoating region has an alternating sequence of optically transparent zones and electrode zones, wherein one optically transparent zone is situated between two electrodes zones and/or one electrode zone is situated between two optically transparent zones. Each optically transparent zone is rear-electrode-layer-free and preferably also absorber-layer-free. Each electrode zone is absorber-layer-free, but has in any case a section of the rear electrode layer and, optionally, a section of the front electrode layer.

It is essential in this embodiment of the invention that the rear electrode layer sections of the zone region portions of the zone region reduced by the first patterning line P1 (without first patterning line P1) are areally connected to one another by the rear electrode layer section of at least one electrode zone such that the rear electrode layer of the zone region is areally continuous. The rear electrode layer sections of the two zone region portions are thus directly connected to one another electrically (in series) by at least one electrode zone.

Generally speaking, the at least one linear decoating region can be arranged in various positions inside the patterning zone and, in particular, can even form a second and/or third patterning line. Various embodiments of the thin-film solar module according to the invention in which this is done are reported in the following.

In the following embodiments, the optically transparent zones of the linear decoating region can have in each case a front electrode layer section or, alternatively, be front-electrode-layer-free:
at least one linear decoating region is arranged between the first patterning line P1 and the second patterning line P2 at least of one patterning zone;
at least one linear decoating region is arranged between the second patterning line P2 and the third patterning line P3 at least of one patterning zone;
at least one linear decoating region is arranged within the second patterning line P2 at least of one patterning zone.

In the following embodiment of the invention, at least one optically transparent zone of the linear decoating region has a front electrode layer section:
the second patterning line P2 at least of one patterning zone is formed by a linear decoating region.

In the following embodiments of the invention, the optically transparent zones of the linear decoating region are in each case front-electrode-layer-free:
at least one linear decoating region is arranged within the third patterning line P3 at least of one patterning zone;
the third patterning line P3 at least of one patterning zone is formed by a linear decoating region;
at least one patterning zone has two third patterning lines P3, P3', wherein at least one linear decoating region is arranged between the two third patterning lines P3, P3';
at least one patterning zone has two third patterning lines P3, P3', wherein one of the two third patterning lines P3, P3' is formed by a linear decoating region.

According to the invention, it is advantageous for the ratio of the total area of all optically transparent zones of the thin-film solar module to the total area of all solar cells to be in the range from 5% to 50%. The optical transparency to visible light averaged over the thin-film solar module is preferably in the range from 5% to 50% and is, in particular, 20%. In this manner, on the one hand, relatively high electrical output can be achieved while, on the other, the optical transmittance is adequately high for practical applications such that a good compromise for the conflicting properties of output and optical transparency can be achieved.

In a particularly advantageous embodiment of the thin-film solar module according to the invention, at least one transparent zone is at least partially, in particular, completely, surrounded by an immediately adjacent edge zone that is absorber-layer-free but has a section of the rear electrode layer. In a linear decoating region, the electrode zones are in each case understood to be a component of an edge zone, in other words, the edge zone of the optically transparent zone includes the electrode zones adjacent the optically transparent zone. The structure of electrode zones and edges zones is thus identical.

When a thermal laser process is used for a decoating process for producing an optically transparent zone, for example, by using a pulsed laser beam with a pulse duration in the range from 5 to 50 nanoseconds, the risk generally exists for short-circuit current paths ("shunts") to develop on the edges of the decoated areas, increasing power losses. This disadvantageous effect can be avoided by partial decoating in the edge zones and the efficiency of the module can be advantageously improved. According to the invention, it is preferable for the ratio of the total area of the optically transparent zones to the total area of the edge zones to be greater than 1, preferably greater than 10. By this means, the advantageous effects mentioned can be achieved satisfactorily without sustaining excessive power loss through the photovoltaically inactive edge zones.

The invention further extends to a method for producing a thin-film solar module implemented as described above.

First, a flat substrate is provided. A rear-electrode-layer is deposited on one side of the substrate. The rear electrode layer can be deposited directly onto a surface of the substrate. Alternatively, at least one additional layer can be situated between the substrate and the rear electrode layer. An absorber layer is deposited over the rear electrode layer.

The rear electrode layer is situated between the substrate and the absorber layer. The absorber layer can be deposited directly onto one surface of the rear electrode layer. Alternatively, at least one additional layer can be situated between the rear electrode layer and the absorber layer. A front electrode layer is deposited over the absorber layer. The absorber layer is situated between the front electrode layer and the rear electrode layer. The front electrode layer can be deposited directly onto a surface of the absorber layer. Alternatively, at least one additional layer can be situated between the front electrode layer and the absorber layer. Typically, at least one buffer layer is situated between the absorber layer and the front electrode layer. A layer structure is formed by the layer sequence at least consisting of the rear electrode layer, the absorber layer, and the front electrode layer.

At least the rear electrode layer is patterned (subdivided) by first patterning lines (P1). The patterning of the rear rear electrode layer is typically, but not mandatorily, done before depositing the absorber layer. At least the absorber layer is patterned (subdivided) by second patterning lines (P2). The patterning of the absorber layer is typically, but not mandatorily, done before depositing the front electrode layer. At least the front electrode layer is patterned (subdivided) by third patterning lines (P3). The creation of the patterning lines is typically done in the order: P1-P2-P3. A direct sequence of a first patterning line (P1), a second patterning line (P2), and a third patterning line (P3) forms a patterning zone (14), with a monolithic serial connection of solar cells being formed by the patterning zones. The solar cells have in each case a rear electrode layer section, due to the subdivision of the rear electrode by the first patterning lines (P1).

Furthermore, one or more optically transparent zones, which are in each case rear-electrode-layer-free, are created by section-wise removal at least of the rear electrode layer in a zone region reduced by the first patterning line P1 of at least of one patterning zone (i.e. patterning zone without first patterning line P1) such that the rear electrode layer is continuous in the zone region. Optionally, the optically transparent zones are in each case surrounding edge zones that are in each case absorber-layer-free but have a rear electrode layer section created by section-wise removal at least of the absorber layer.

According to an advantageous embodiment of the invention, at least one linear decoating region is created in the zone region reduced by the first patterning line P1 at least of one patterning zone, by which the zone region is subdivided into two zone region portions. The decoating region has an alternating sequence of at least two optically transparent zones and at least one electrode zone, wherein each optically transparent zone is rear-electrode-layer-free and each electrode zone is absorber-layer-free and has a rear electrode layer section, wherein the rear-electrode-layer-section of the at least one electrode zone areally bonds two rear electrode layer sections of the zone region portions to one another. The electrode zones are created by section-wise removal at least of the absorber layer. The optically transparent zones can in each case be surrounded by an edge zone, wherein the edge zones include the electrode zones as sections.

The edge zones surround in each case an optically transparent zone. If a linear decoating region is provided and the optically transparent zones of the linear decoating region are in each case provided with edge zones, the electrode zones of the linear decoating region are components of the edge zones, in other words, are contained in the edge zones.

According to one embodiment of the method according to the invention, the optically transparent zones are created by section-wise removal at least of the rear electrode layer by irradiation with a pulsed laser beam and/or by mechanical material removal.

According to another embodiment of the method according to the invention, the electrode zones or the edge zones that surround the optically transparent zones are created by section-wise removal at least of the absorber layer by irradiation with a pulsed laser beam and/or mechanical material removal.

Generally speaking, the optically transparent zones can be created before making the patterning zones, in other words, during the process of the formation and monolithic serial connection of the solar cells, or after making the patterning zones, in other words, after creating the monolithic serial connection of the solar cells. The same is true for the optional electrode zones and the optional edge zones, which can be created during or after making the patterning zones.

In an advantageous embodiment of the invention, the optically transparent zones are produced before making the patterning zones. The optional electrode zones or the optional edge zones are produced after making the patterning zones.

Advantageously, such a method includes a step in which the optically transparent zones are produced by section-wise removal at least of the rear electrode layer before depositing the absorber layer. The decoating of the rear electrode layer is preferably done by irradiation with a laser beam. The method optionally includes a further step in which the electrode zones or the edge zones are produced after depositing the absorber layer and front electrode layer, as well as after producing the third patterning lines (P3), by section-wise removal at least of the absorber layer and the front electrode layer. The decoating of the absorber layer and the front electrode layer is preferably done by mechanical material removal.

In another advantageous embodiment of the invention, the optically transparent zones, as well as, possibly, the optional electrode zones or the optional edge zones, are produced only after making the patterning zones, in other words, after producing the monolithic serial connection of the solar cells. This procedure has the advantage that serial connections of solar cells of thin-film solar modules produced conventionally can be subjected to the method according to the invention in order to provide the thin-film solar modules with the desired semitransparency. The methods already used for producing serially connected solar cells can advantageously be retained.

Advantageously, such a method for producing optically transparent zones that are surrounded by edge zones includes a step in which at least the absorber layer is removed section-wise in processing zones. The processing zones correspond in their dimensions in each case to the dimensions of the optically transparent zone and edge zones to be produced. Here, the optically transparent zones are produced in the inner regions of the processing zones, and the edge zones are produced in edge regions of the processing zones surrounding the inner region in each case. Layer removal in the processing zones is preferably done by mechanical material removal. The method includes a further step wherein at least the rear electrode layer is removed in the inner regions of the processing zones, by which means the optically transparent zones are produced. The edge regions, which surround the rear-electrode-layer-free inner regions of the processing zones, form the absorber-layer-free edge zones, which do however have a section of the rear electrode layer. Layer removal in the inner regions is preferably done by irradiation with a pulsed laser beam.

According to one embodiment of the invention, the optically transparent zones are produced by irradiation at least of the rear electrode layer, in particular of the layer structure, with a pulsed laser beam, with the pulses having a pulse duration of less than 1 nanosecond. Alternatively, the optically transparent zones are produced by irradiation at least of the rear electrode layer, in particular of the layer structure, with a pulsed laser beam, with the pulses having a pulse duration of at least 1 nanosecond. Also conceivable is mechanical material removal, for example, by needle writing, brushing, or scraping. Preferably, a pulsed laser beam, whose pulse has a duration of less than 1 nanosecond, particularly preferably less than 100 picoseconds, is used for producing the optically transparent zones. As experiments by the inventors revealed, the use of laser pulses with a longer pulse width in the range, for example, from 5 to 50 nanoseconds result in local damaging of the layer structures due to high heat influx into the absorber layer and the production of fused connections between the front and the rear electrode layer. Surprisingly, it was advantageously possible to significantly reduce these disadvantageous effects through the use of laser pulses with a duration of less than 1 nanosecond.

Preferably, even the electrode zones or edge zones are produced by irradiation at least of the absorber layer with a pulsed laser beam, wherein the pulses have a pulse duration of less than 1 nanosecond, preferably less than 100 picoseconds, in order to avoid the production of fused connections. Alternatively, layer removal can be done by mechanical material removal, for example, by needle writing, brushing, or scraping.

The selective removal of layers in the layer structure using a laser beam for producing optically transparent zones, as well as electrode zones or edge zones can be achieved, in particular, by altering one or more of the following process parameters:
  laser power,
  traveling speed of the laser beam relative to the irradiated surface of the layer structure or substrate,
  laser pulse repetition rate,
  pulse duration,
  on- or off-period of the laser.

In particular, the depth of the hole produced in particular in the layer structure can be varied by spatial overlapping of laser pulses, by which means, for example, in the case of electrode zones or edge zones, essentially, only the layers above the rear electrode layer can be removed.

The production of optically transparent zones and electrode zones or edge zones by means of laser pulses can be done, for example, in a single-stage procedure during a single process step, for example, by changing the process parameters irradiation power and/or repetition rate of the laser pulses. Here, in each case, an optically transparent zone and then an electrode zone or an edge zone are produced. Also possible, however, is a two-stage procedure wherein all optically transparent zones are produced in a first process step and all electrode zones or edge zones are produced in a further process step with altered process parameters. Here, the order is irrelevant.

In an embodiment of the invention advantageous in terms of cost, the optically transparent zones in the layer structure (i.e., making the patterning zones) are produced using a pulsed laser beam of a laser beam source, wherein the pulses of the laser beam have a pulse duration of more than 1 nanosecond, in particular in the range from 5 to 50 nanoseconds. Then, optionally, the electrode zones or the edge zones are produced using a pulsed laser beam of a laser beam source wherein the pulses of the laser beam have a duration of less than 1 nanosecond, preferably less than 100 picoseconds. Alternatively, the electrode zones or edge zones can be produced using mechanical material removal in the layer structure, for example, by needle writing, brushing, or scraping. Preferable for economic reasons is the use of mechanical material removal in the layer structure for producing the electrode zones or edge zones.

In the method according to the invention, layer removal in the layer structure (after making the patterning zones) can be done by irradiation from the side of the layer structure using a pulsed laser for producing the optically transparent zones, as well as, optionally, electrode zones or edge zones. Alternatively, layer removal can be done through a transparent substrate ("ablation"). To this end, the layer structure is applied on a transparent substrate, for example, glass. During ablation, the laser energy introduced is absorbed on the rear electrode layer, with a small part of the rear electrode vaporizing, such that the rear electrode layer with the complete layer structure above it bulges due to the expanding gas. This happens until the bulged region breaks off from the surrounding layer stack in a circular shape. As a result of the breaking off, the edges of the circular region remain shunt-free since no appreciable laser energy has melted this edge region or even fused rear and front electrodes. In this manner, transparent zones with a relatively small proportion of shunt paths can be produced, by which means performance losses of the module can be reduced.

The various embodiments of the invention can be realized individually or in any combinations. In particular, the features mentioned above and to be explained in the following can be used not only in the combinations indicated but also in other combinations or in isolation without departing from the scope of the invention.

Figure 3:
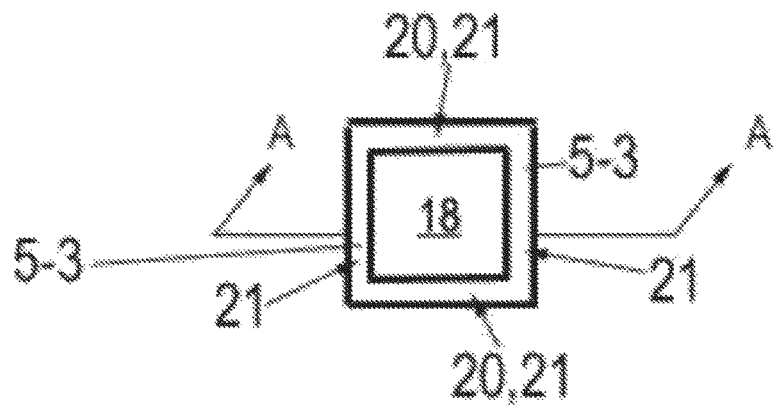
Figure 4:
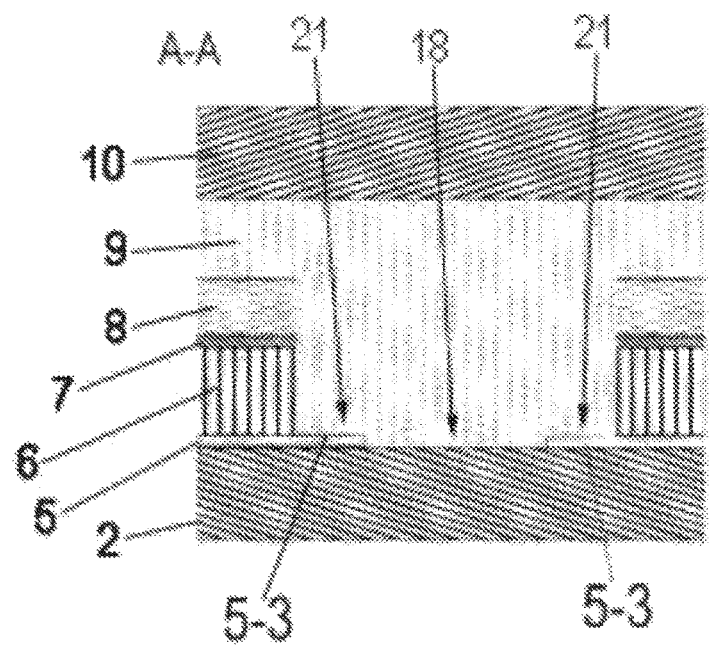
Figure 7A:
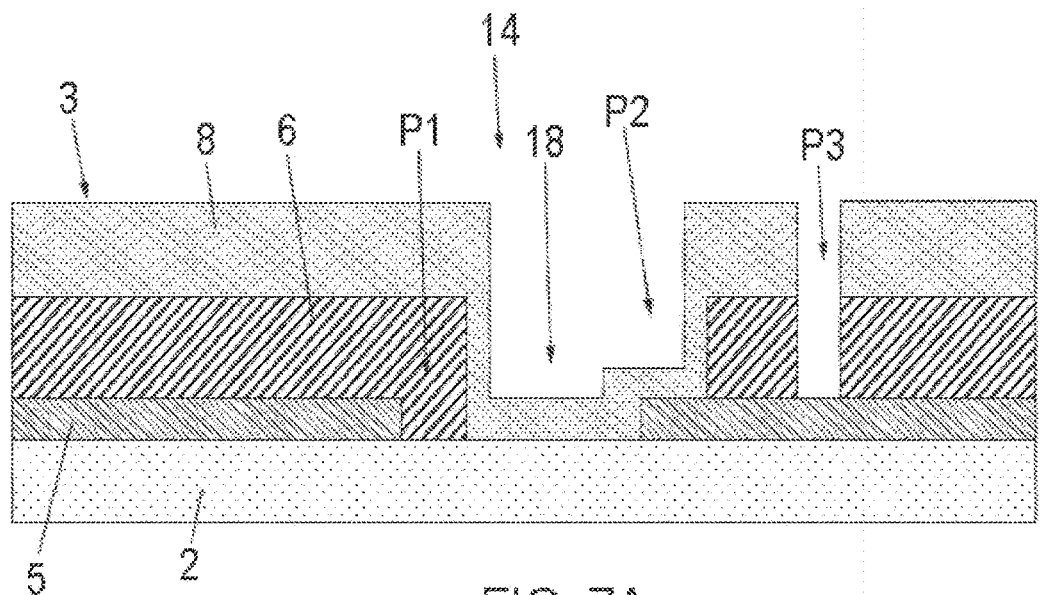
Figure 7B:
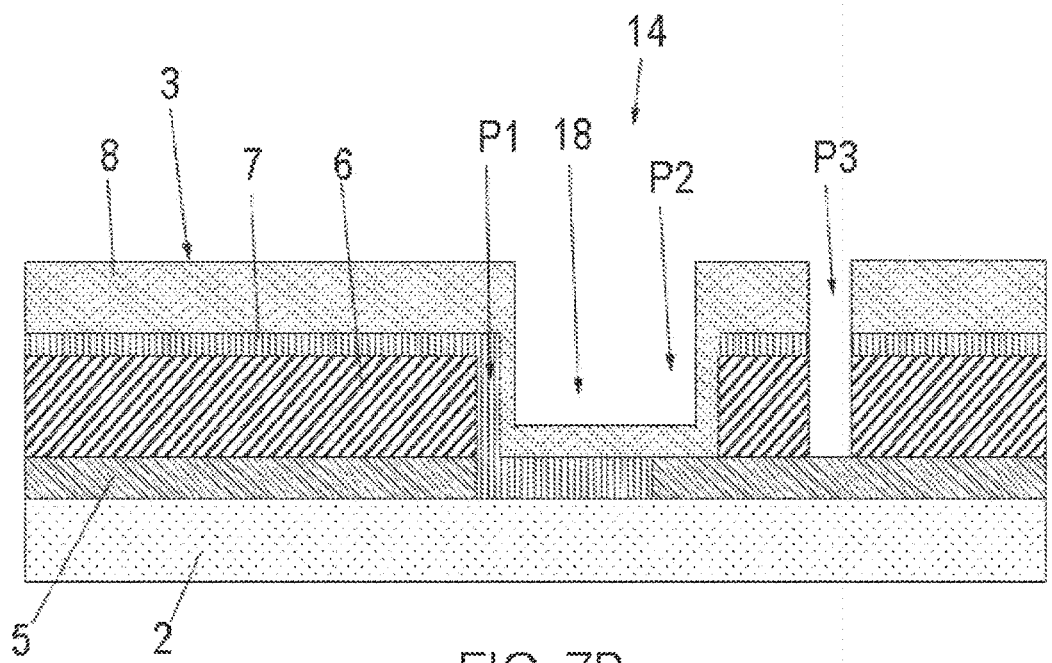
Figure 8:
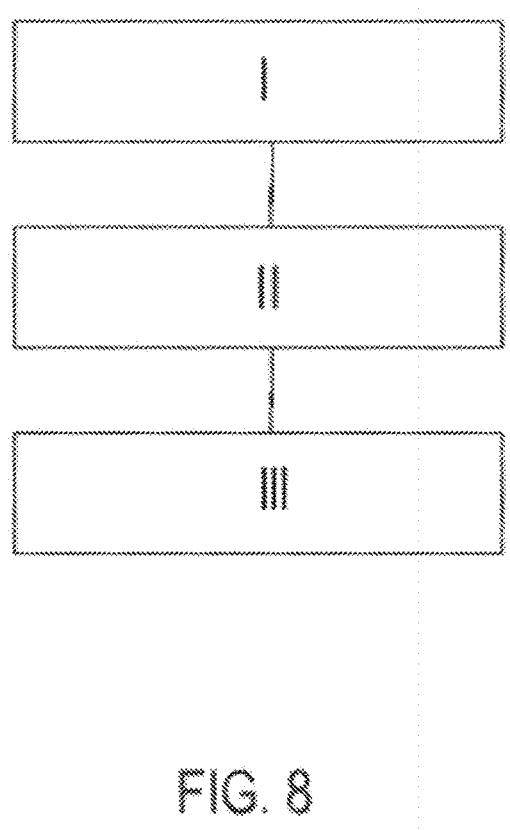

The invention is now explained in detail using exemplary embodiments and referring to the accompanying figures. They depict, in simplified, not to scale representation:

FIG. 1 a schematic representation of the integrated serial connection of solar cells according to one embodiment of the thin-film solar module according to the invention in cross-section;

FIG. 2A-2D exemplary embodiments of the patterning zones of the thin-film solar module according to the invention in plan view;

FIG. 3 a schematic representation of an optically transparent zone with a surrounding edge zone;

FIG. 4 a cross-sectional view of the optically transparent zone with a surrounding edge zone of FIG. 3;

FIG. 5A-5C further exemplary embodiments of the patterning zones of the thin-film solar module according to the invention in plan view;

FIG. 6A-6C further exemplary embodiments of the thin-film solar module according to the invention in plan view;

FIG. 7A-7B in each case, a cross-sectional view of a further embodiment of the patterning zones according to the invention;

FIG. 8 a flowchart to illustrate an exemplary embodiment of the method according to the invention.

DETAILED DESCRIPTION OF THE DRAWINGS

FIG. 1 schematically illustrates a thin-film solar module according to the present invention referenced as a whole with the number 1 using a cross-sectional view. The thin-film solar module 1 comprises a plurality of solar cells 11 serially connected one to another in integrated form, wherein in a greatly simplified manner only two solar cells 11 are depicted. Of course, generally speaking, in the thin-film solar module 1, a large number of solar cells 11 (for example, approximately 100-150) are serially connected.

The thin-film solar module 1 has a composite pane structure in substrate configuration, in other words, it has a first substrate 2 with a layer structure 3 made of thin films applied thereon, wherein the layer structure 3 is arranged on a light-entry side surface of the first substrate 2. Here, the first substrate 2 is implemented, for example, as a rigid glass plate with relatively high light transmittance, while other electrically insulating materials with desired stability and inert behavior relative to the process steps carried out can equally be used.

The layer structure 3 includes, arranged on the light-entry side surface of the first substrate 2, an opaque rear electrode layer 5, which is made, for example, from a light-impermeable metal such as molybdenum (Mo) and was applied on the first substrate 2 by vapor deposition or magnetron-enhanced cathodic sputtering (sputtering). The rear electrode layer 5 has, for example, a layer thickness in the range from 300 nm to 600 nm.

A photovoltaically active (opaque) absorber layer 6 that is made of a semiconductor doped with metal ions whose bandgap is capable of absorbing the greatest possible share of sunlight is applied on the rear electrode layer 5. The absorber layer 6 is made, for example, of a p-conductive chalcopyrite compound semiconductor, for example, a compound of the group $Cu(In/Ga)(S/Se)_2$, in particular sodium (Na)-doped $Cu(In/Ga)(S/Se)_2$. The preceding formulas are understood to mean that indium (In) or gallium (Ga) as well as sulfur (S) or selenium (Se) can be present alternatively or in combination. The absorber layer 6 has a layer thickness that is, for example, in the range from 1 to 5 µm and is, in particular, approx. 2 µm. Typically, for the production of the absorber layer 6, various material layers are applied, for example, by sputtering, and are subsequently thermally converted to form the compound semiconductor by heating in a furnace (RTP=rapid thermal processing), optionally, in an atmosphere containing S— and/or Se. This manner of production of a compound semiconductor is well known to the person skilled in the art such that it need not be discussed in detail here.

Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1.

A front electrode layer 8 is applied on the buffer layer 7, for example, by sputtering. The front electrode layer 8 is transparent to radiation in the visible spectral range ("window electrode") such that the incoming sunlight (depicted in FIG. 1 by four parallel arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. A heterojunction (i.e., a sequence of layers of opposing conductor type) is formed by the front electrode layer 8 together with the buffer layer 7 and the absorber layer 6. The buffer layer 7 can effect electronic adaptation between the absorber layer 6 and the front electrode layer 8.

For the formation and serial connection of the solar cells 11, the layer structure 3 was patterned using suitable patterning technology, for example, laser lithography and/or mechanical removal. Typically, a plurality of immediate sequences of three patterning lines P1-P2-P3 in each case in the form of layer ditches are introduced into the layer structure 3 in this order. Here, at least the rear electrode 5 is subdivided by first patterning lines P1; at least the absorber layer, by second patterning lines P2; and at least the front electrode layer 8, by third patterning lines P3 by production of respective ditches. Via the second patterning lines P2, the front electrode layer 8 of one solar cell 11 is in each case electrically conductively connected to the rear electrode layer 5 of an adjacent solar cell 11, with the front electrode layer 8 directly contacting the rear electrode layer 5, for example. In the exemplary embodiment depicted, the ditches of the first patterning lines P1 are filled by material of the absorber layer 6. The ditches of the second patterning lines P2 are filled by material of the front electrode layer 8, and the ditches of the third patterning lines P3 are filled by the adhesive layer 9 mentioned in the following. Each immediate sequence of a first, second, and third patterning line P1-P2-P3 forms a patterning zone 14. In FIG. 1, by way of example, only a single patterning zone 14 is depicted, by means of which the serial connection of two adjacent solar cells 11 is defined, wherein it is understood that in the thin-film solar module 1, a large number of such patterning zones 14 are provided for the patterning and serial connection of solar cells 11.

In the exemplary embodiment depicted here, both the positive power connector (+) and the negative power connector (−) of the thin-film solar module 1 are routed via the rear electrode layer 5 and electrically contacted there. For this purpose, the layers of the layer structure 3 are removed all the way to the rear electrode layer 5 in the two peripheral connection sections 13 of the thin-film solar module 1.

For protection against environmental influences, a (plastic) adhesive layer 9 that serves to encapsulate the layer structure 3 is applied on the front electrode layer 8. Adhesively bonded with the adhesive layer 9 is a second substrate 10 transparent to sunlight that is implemented, for example, in the form of a glass sheet made of extra white glass with a low iron content, with the equally possible use of other electrically insulating materials with desired strength and inert behavior relative to the process steps carried out. The second substrate 10 serves for the sealing and for the mechanical protection of the layer structure 3. The thin-film solar module 1 can absorb light via the front-side module surface 4 of the second substrate 10 in order to produce an electrical voltage on the two power connectors (+,−). A resulting current path is depicted in FIG. 1 by serially arranged arrows.

The two substrates 2, 10 are fixedly bonded ("laminated") to one another via the adhesive layer 9, with the adhesive layer 9 implemented here, for example, as a thermoplastic adhesive layer, which can be reshaped plastically by heating and which fixedly bonds the two substrates 2, 10 to one another during cooling. The adhesive layer 9 is made here, for example, of PVB. Together, the two substrates 2, 10 with the solar cells 11 embedded in the adhesive layer 9 form a laminated composite 12.

Reference is now made to FIG. 2A-2D, wherein exemplary embodiments of the patterning zone 14 of the thin-film solar module 1 according to the invention are depicted schematically in plan view. FIG. 2A-2D depict in each case only one single patterning zone 14, while the thin-film solar module 1 typically has a large number of patterning zones 14 (e.g., approx. 100). The patterning zones 14 form in each case a photovoltaically inactive dead zone 17 that can make no contribution to energy production.

The patterning zones 14 are in each case arranged parallel to the module edge, here, for example, in x-direction, which can also be referred to as the width of the thin-film solar module 1. The y-direction perpendicular thereto can be referred to as the length of the thin-film solar module 1. The peripheral connection sections 13 depicted in FIG. 1 are not shown in FIG. 2A-2D. The two connection sections 13 also form in each case a photovoltaically inactive dead zone that can make no contribution to energy production.

Situated on both sides adjacent a patterning zone 14 is, in each case, a layer region 16 that represents, in the context of the present invention, a solar cell 11 with an optically active zone. In the inner region of the thin-film solar module 1, each layer region 16 is arranged between two immediately adjacent patterning zones 14 and is delimited thereby. In the case of the two peripheral solar cells 11, the layer region 16 is, in each case, arranged between a patterning zone 14 and the adjacent connector section 13 shown in FIG. 1 and is delimited thereby. The layer region 16 comprises in each case a section of the rear electrode layer 5, absorber layer 6, buffer layer 7 and front electrode layer 8, which are the rear electrode, absorber, and front electrode of the solar cell 11.

The patterning zones 14 of FIG. 2A-2D have in each case, in a zone region 22 reduced by the first patterning line P1 (without first patterning line P1), a plurality of optically transparent zones 18, which are here arranged, for example, linearly in x-direction and parallel to the patterning lines P1-P3. Here, it is essential that the optically transparent zones 18 are implemented such that the rear electrode layer 5 is (areally) continuous in the zone region 22 of the patterning zone 14, i.e., is not completely subdivided into sections spatially separated from one another. The optically transparent zones 18 have each case a square shape. However, in principle, the transparent zones 18 can have any shape, for example, linear, punctiform, or circular disc-shaped. Each optically transparent zone 18 is surrounded by an edge zone 21.

The structure of an optically transparent zone 18 and edge zone 21 is illustrated in FIGS. 3 and 4, wherein FIG. 4, which is a cross-sectional view of FIG. 3 along the section line A-A, shows the layer sequence. Accordingly, the optically transparent zone 18 is, for achieving the desired optical transparency of the thin-film solar module 1, rear-electrode-layer-free and preferably also absorber-layer-free, but can, however, for example, have a front electrode layer section, which is not shown in FIGS. 3 and 4. As shown in FIG. 4, in the optically transparent zone 18, for example, all layers of the layer structure 3 are removed all the way to the substrate 2 (in other words, rear electrode layer 5, absorber layer 6, buffer layer 7, and front electrode layer 8). However, it is also possible that not all layers of the layer structure 3 are removed in the optically transparent zone 18, with, in any case, the generally opaque rear electrode layer 5 removed.

The optically transparent zone 18 is surrounded by an edge zone 21. In the edge zone 21, all layers are removed, with the exception of a rear electrode layer section 5-3. By means of the edge zone 21, short-circuit current paths on the edges of the decoated areas can advantageously be avoided. Advantageously, the ratio of the total area of the optically transparent zones 18 to the total area of the edge zones 21 is greater than 1, preferably greater than 10.

Figure 2:
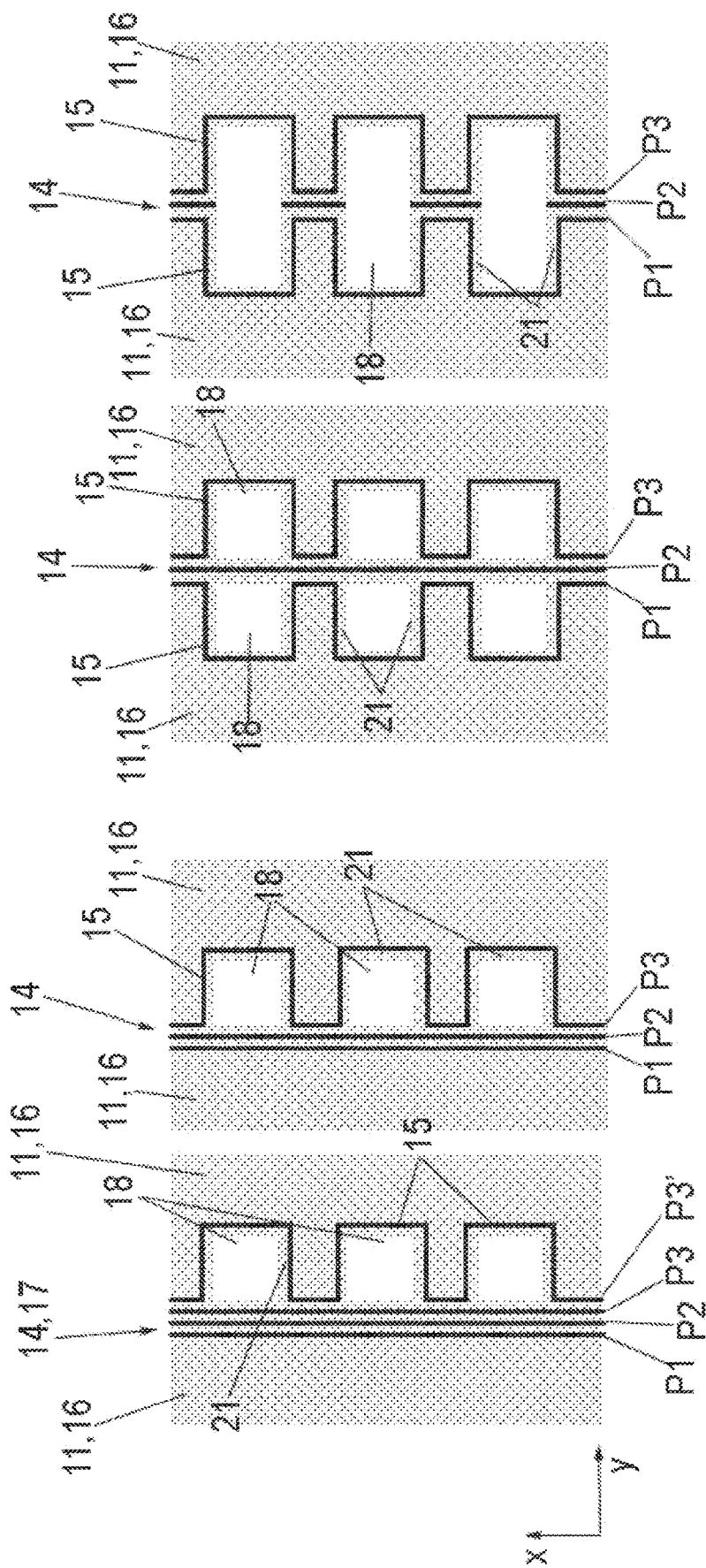

Reference is now made again to FIG. 2A-2D. The various embodiments of the patterning zones 14 in FIG. 2A-2D differ as follows:

In FIG. 2A, the patterning zone 14 comprises one first patterning line P1, one second patterning line P2, and two third patterning lines P3 and P3'. The outwardly positioned third patterning line P3' is provided with a plurality of square-shaped bulges 15, in which, in each case, an optically transparent zone 18 is arranged. The bulges 15 of the third patterning line P3 bulge in each case in a direction away from the first patterning line P1 (i.e., in the positive y-direction).

In contrast thereto, in FIG. 2B, the patterning zone 14 comprises one first patterning line P1, one second patterning line P2, and only one third patterning line P3. Analogously to FIG. 2A, the third patterning line P3 is provided with a plurality of square-shaped bulges 15 in which, in each case, an optically transparent zone 18 is arranged.

In FIG. 2C, the patterning zone 14 comprises one first patterning line P1, one second patterning line P2, and one third patterning line P3. The third patterning line P3 is provided with a plurality of square-shaped bulges 15 in the positive y-direction, in which, in each case, an optically transparent zone 18 is arranged. In addition, the first patterning line P1 is provided with a plurality of square-shaped bulges 15 in the negative y-direction, in which, in each case, an optically transparent zone 18 is arranged. The bulges 15 of the third patterning line P3 and the bulges 15 of the first patterning line P1 are positioned opposite one another.

The embodiment of the patterning zone 14 of FIG. 2D differs from the embodiment of FIG. 2C only in that the second patterning line P2 is not continuous in the region between the bulges 15, but is, instead, interrupted. The two optically transparent zones 18, which are arranged in the bulge 15 of the first patterning line P1 and in the bulge 15 of the third patterning line P3, are combined to form a common optically transparent zone 18.

Reference is now made to FIG. 5A-5C, wherein additional exemplary embodiments of the patterning zone 14 of the thin-film solar module 1 according to the invention are illustrated schematically in plan view. Accordingly, the patterning zone 14 comprises at least one linear decoating region 19, which extends parallel to the patterning lines P1-P2-P3, i.e., in x-direction, continuously over the full dimension of the patterning zone 14. Advantageously, all patterning zones 14 of the thin-film solar module 1 have one or more linear decoating regions 19. The linear decoating region 19 is in each case arranged in a zone region 22 reduced by the first patterning line P1, i.e., in a remaining region of the patterning zone 14 without the first patterning line P1. By means of the linear decoating region 19, the zone region 22 is subdivided into two zone region portions 22-1, 22-2. One zone region portion 22-1 includes a rear electrode layer section 5-1; the other zone region portion 22-2 includes a rear electrode layer section 5-2 different therefrom.

Each linear decoating region 19 is composed of a plurality of optically transparent zones 18 and a plurality of electrodes zones 20 in alternating sequence, in other words, one optically transparent zone 18 is situated between two electrodes zones 20 and/or one electrode zone 20 is situated between two optically transparent zones 18. The optically transparent zones 18 and electrode zones 20 have a structure as it has already been described in conjunction with FIGS. 3 and 4. The electrode zones 20 are sections of the edge zone 21 surrounding the optically transparent zone 18, which sections are positioned opposite one another. Accordingly, the layer sequence in the electrode zones 20 corresponds to that of the edge zone 21 such that, in the electrode zones 20, all layers with the exception of a rear electrode layer section 5-3 are removed. The electrode zones 20 can in each case also have a front electrode layer section 8-3.

As illustrated in FIG. 5A-5D, the electrode zones 20 are those sections of the edge zone 21 that completely bridge the linear decoating region 19 (perpendicular to the extension direction of the patterning zone 14) in y-direction. Here, each electrode zone 20 is, for example, rectangular. The spatially separated from one another rear electrode layer sections 5-1, 5-2 of the two zone region portions 22-1, 22-2 are areally connected to one another such that the rear electrode layer 5 of the zone region 22 of the patterning zone 14 is areally continuous. The two zone region portions 22-1, 22-2 are directly connected electrically to one another in series via the rear electrode layer sections 5-3 of the electrode zones 20. Of course, the rear electrode layer sections 5-1, 5-2 of the two zone region portions 22-1, 22-2 of one and the same zone region 22 can be areally connected to one another by one or more electrodes zones 20. It is equally conceivable for the linear decoating region 19 not to be parallel to the patterning zone 14 but, rather, aligned obliquely at an angle other than 0° relative to the patterning zone 14.

In the thin-film solar module 1 according to the invention, the solar cells 11 are opaque and have transmittance for visible light of less than 5%. In contrast to this, the optically transparent zones 18 have transmittance for visible light of at least 85%. The ratio of the total area of all optically transparent zones 18 to the total area of the solar cells 11 is in the range from 5% to 50%. Thus, the optical transparency of the semitransparent thin-film solar module averaged over the total area of the thin-film solar module 1 is also in the range from 5% to 50% and is, in particular, 20%. The optically transparent zones 18 are arranged uniformly distributed along the linear decoating region 19, by which means a very smooth overall visual effect can be obtained.

In FIG. 5A, the linear decoating region 19 is arranged between the first patterning line P1 and the second patterning line P2 of the patterning zone 14. In FIG. 5B, the linear decoating region 19 is arranged between the second patterning line P2 and the third patterning line P3 of the patterning zone 14. In FIG. 5C, the linear decoating region 19 is arranged between the first patterning line P1 and the third patterning line P3 and forms the (single) second patterning line P2 of the patterning zone 14. Thus, the formation of a separate second patterning line P2 can be dispensed with.

In the two embodiments of FIGS. 5A and 5B, it would be possible for the electrode zones 20 to have, in each case, no front electrode layer section 8-3. For the embodiment of FIG. 5C, it is, however, necessary for at least one electrode zone 20, in particular all electrode zones 20, to have a front electrode layer section 8-3, since due to the function as a second patterning line P2, a serial connection of the solar cells 11 adjacent the patterning zone 14 must be enabled.

In FIG. 6A through 6C, by way of example, additional embodiments of the patterning zone 14 of the thin-film solar module according to the invention are in each case schematically depicted in plan view. To avoid unnecessary repetition, only the differences relative to the embodiments of FIG. 5A through 5C are explained and, otherwise, reference is made to the statements there. In the embodiments of FIG. 6A through 6C, the electrode zones 20 have in each case no front electrode layer section 8-3.

In the embodiment of FIG. 6A, the patterning zone 14 has, in addition to a first patterning line P1 and a second patterning line P2, two third patterning lines P3 and P3' positioned near one another, with the patterning line P3' positioned farther outward compared to the patterning line P3 being formed by the linear decoating region 19.

In the embodiment of FIG. 6B, the patterning zone 14 has, in addition to a first patterning line P1 and a second patterning line P2, a single third patterning line P3, with the third patterning line P3 being formed by the linear decoating region 19.

In the embodiment of FIG. 6C, the patterning zone 14 has, in addition to a first patterning line P1 and a second patterning line P2, two third patterning lines P3 and P3' positioned near one another, with the linear decoating region 19 arranged between the two third patterning lines P3 and P3'.

FIGS. 7A and 7B schematically depict in each case cross-sectional views of an embodiment of the patterning zone 14 according to the invention.

In FIG. 7A, the layer structure 3 applied on the substrate 2 comprises an opaque rear electrode layer 5, an absorber layer 6, and a front electrode layer 8. In the layer structure of FIG. 7B, a buffer layer 7 is additionally provided. The layer structure is patterned in each case by a first patterning line P1, a second patterning line P2, and a third patterning line P3. An optically transparent zone 18, in which the rear electrode layer 5 is removed, is arranged between the first patterning line P1 and the second patterning line P2, corresponding to the embodiment of FIG. 5A. In FIG. 7A, the first patterning line P1 is filled by material of the absorber layer 6, and the optically transparent zone 18 is filled by the material of the front electrode layer 8. Formation of the optically transparent zone 18 is done after depositing the absorber layer 6 and before depositing the front electrode layer 8. In FIG. 7B, both the first patterning line P1 and the optically transparent zone 18 are filled by the material of the buffer layer 7, with formation of the optically transparent zone 18 done before depositing the buffer layer 7 and the front electrode layer 8.

FIG. 8 illustrates an exemplary method for producing the thin-film solar module 1 according to the invention.

According to it, in step I, a substrate 2 with a layer structure 3 with patterning zones 14 introduced therein for the formation of serially connected solar cells 11 is provided.

In step II, the optically transparent zones 18 are produced by removal of all layers of the layer structure 3 all the way to the substrate 2 using a pulsed laser beam of a laser beam source. For this purpose, the layer structure 3 is irradiated with a pulsed laser beam, with pulses having a duration of less than 1 nanosecond. The layer structure 3 is preferably irradiated through the transparent substrate 2; however, direct irradiation of the layer structure 3 from the side facing away from the substrate 2 is also possible. Alternatively, the optically transparent zones 18 can be produced by mechanical material removal. The optically transparent zones 18 are respectively produced in the zone regions 22 reduced by the first patterning line P1 such that the rear electrode layer 5 in the zone regions 22 is in each case continuous.

In an optional step III, edge zones 21 are produced around the optically transparent zones 18. The edge zones 21 are produced by irradiation of the layer structure 3 with a pulsed laser beam, with the pulses having a duration of less than 1 nanosecond, and/or by mechanical material removal. When edge zones 21 are produced around the optically transparent zones 18, it is possible to also produce the optically transparent zones 18 by irradiation with a pulsed laser, whose pulses have a duration of at least 1 nanosecond.

The invention advantageously makes available a semitransparent thin-film solar module. The patterning zones of the solar cells have optically transparent zones and are, in particular, subdivided by linear decoating regions, wherein each linear decoating region has optically transparent zones and electrode zones in an alternating sequence. The patterning zones have, in a zone region reduced by the first patterning line (without first patterning line), a continuous rear electrode layer.

As is evident from the above description, the invention advantageously enables technically relatively uncomplicated, highly versatile, and economical production of the thin-film solar module, wherein a relatively large optically active area with comparatively high visible-light transmittance of the thin-film solar module can be obtained.

LIST OF REFERENCE CHARACTERS 1 thin-film solar module
2 first substrate
3 layer structure
4 module surface
5 rear electrode layer
5-1,5-2,5-3 rear electrode layer section
6 absorber layer
7 buffer layer
8 front electrode layer
8-3 front electrode layer section
9 adhesive layer
10 second substrate
11 solar cell
12 composite
13 connection section
14 patterning zone
15 bulge
16 layer region
17 dead zone
18 optically transparent zone
19 decoating region
20 electrode zone
21 edge zone
22 zone region
22-1,22-2 zone region portion

The invention claimed is:

1. A thin-film solar module, comprising:
a substrate and a layer structure applied thereon, the layer structure comprising an opaque rear electrode layer, a front electrode layer, an absorber layer arranged between the rear electrode layer and a buffer layer, and the buffer layer arranged between the absorber layer and the front electrode layer; and
serially connected solar cells formed in the layer structure by patterning zones, each patterning zone comprising a first patterning line for subdividing at least the rear electrode layer, a second patterning line for subdividing at least the absorber layer, and at least one third patterning line for subdividing at least the front electrode layer, wherein at least one patterning zone has, in a reduced zone region reduced by the first patterning line, one or more rear-electrode layer-free optically transparent zones implemented such that the rear electrode layer is continuous in an area in the reduced zone region and is not completely subdivided by the rear electrode-free transparent zones in the reduced zone region reduced by the first patterning line, wherein the one or more optically transparent zones is filled by material of the buffer layer, wherein the buffer layer is in direct contact with the rear electrode layer.

2. The thin-film solar module according to claim 1, wherein the one or more optically transparent zones each comprise a front electrode layer section.

3. The thin-film solar module according to claim 1, wherein the one or more optically transparent zones are front-electrode-layer-free.

4. The thin-film solar module according to claim 1, wherein the one or more optically transparent zones are a plurality of linearly arranged optically transparent zones.

5. The thin-film solar module according to claim 1, wherein, in at least one patterning zone, the first patterning line and/or the third patterning line are provided with one or more bulges each having an optically transparent zone arranged therein.

6. The thin-film solar module according to claim 5, wherein the first patterning line and the at least one third patterning line of the patterning zone are provided with at least one bulge, and wherein at least one bulge of the first patterning line is arranged opposite a bulge of the third patterning line.

7. The thin-film solar module according to claim 1,
wherein the reduced zone region around the first patterning line has at least one linear decoating region, by which the reduced zone is subdivided into two zone region portions,
each said at least one decoating region having an alternating sequence of optically transparent zones and electrode zones,
each optically transparent zone being rear-electrode-layer-free, and
each electrode zone being absorber-layer-free and having a rear electrode layer section, and
wherein each rear electrode layer section of the two zone region portions are areally connected to one another by the rear electrode layer section of at least one electrode zone.

8. The thin-film solar module according to claim 7, wherein at least one linear decorating region is arranged according to one or more of:
i) between the first patterning line and the second patterning line;
ii) between the second patterning line and the third patterning line; and
iii) inside the second patterning line.

9. The thin-film solar module according to claim 7, wherein the second patterning line is formed by a linear decoating region.

10. The thin-film solar module according to claim 7, wherein at least one linear decoating region is arranged within or forms the third patterning line.

11. The thin-film solar module according to claim 1, wherein at least one optically transparent zone of the one or more rear electrode layer free optically transparent zones is surrounded by an immediately adjacent absorbent-layer-free edge zone having a rear electrode layer section.

12. The thin-film solar module of claim 1, wherein the buffer layer comprises cadmium sulfide or zinc oxide.

13. The thin-film solar module of claim 1, wherein the buffer layer consists of a single layer of CdS and a single layer of i-ZnO.

14. The thin-film solar module of claim 1, wherein the first patterning line is filled with material of the absorber layer.

15. The thin-film solar module of claim 1, wherein the first patterning line is filled with material of the buffer layer.

* * * * *